United States Patent
Eccarius et al.

(10) Patent No.: US 11,083,114 B2
(45) Date of Patent: Aug. 3, 2021

(54) EMC COOLING DEVICE

(71) Applicant: ebm-papst Mulfingen GmbH & Co. KG, Mulfingen (DE)

(72) Inventors: Michael Eccarius, Mulfingen (DE); Günter Haas, Mulfingen (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 216 days.

(21) Appl. No.: 16/461,515

(22) PCT Filed: Oct. 24, 2017

(86) PCT No.: PCT/EP2017/077047
§ 371 (c)(1),
(2) Date: May 16, 2019

(87) PCT Pub. No.: WO2018/108367
PCT Pub. Date: Jun. 21, 2018

(65) Prior Publication Data
US 2020/0236822 A1    Jul. 23, 2020

(30) Foreign Application Priority Data
Dec. 12, 2016  (DE) ..................... 10 2016 124 099.0

(51) Int. Cl.
*H05K 7/20* (2006.01)
*H04B 15/02* (2006.01)

(52) U.S. Cl.
CPC ......... *H05K 7/20909* (2013.01); *H04B 15/02* (2013.01)

(58) Field of Classification Search
CPC ........... H05K 7/20909; H05K 7/20936; H05K 7/207; H05K 7/1432; H04B 15/02; H04B 1/036; Y02B 30/70; F25B 2600/021
See application file for complete search history.

(56) References Cited

U.S. PATENT DOCUMENTS

| | | | | |
|---|---|---|---|---|
| 5,181,948 A | * | 1/1993 | Belgum | C03B 23/0473 219/121.73 |
| 7,813,128 B2 | * | 10/2010 | Marchand | H05K 7/20909 361/694 |

(Continued)

FOREIGN PATENT DOCUMENTS

| | | |
|---|---|---|
| DE | 20 2006 019141 U1 | 3/2007 |
| DE | 10 2011 084942 A1 | 4/2013 |

OTHER PUBLICATIONS

International Search Report for International Application No. PCT/EP2017/077047, dated Feb. 16, 2018, 2 pgs.

*Primary Examiner* — Zachary Pape
(74) *Attorney, Agent, or Firm* — Dickinson Wright PLLC

(57) ABSTRACT

The present disclosure relates to a cooling apparatus (1) comprising a metal and/or electrically conductive EMC enclosure (2) and a converter ($E_1$) and also a plurality of electrically operated units ($E_2$, . . . , $E_n$) within the EMC enclosure (2) which are designed to influence a local temperature in at least one region (30, 31) inside or outside the EMC enclosure (2), wherein the converter ($E_1$) directly supplies at least one or more of the units ($E_2$, . . . , $E_n$) with a respective supply voltage, and wherein the converter ($E_1$) and the units ($E_2$, . . . , $E_n$) are each designed such that the line-bound and/or field-bound interference ($S_{xy}$) which is specifically generated by this unit during operation of the cooling apparatus (1) is compensated for by a line-bound and/or field-bound interference ($S_{xy}$) of at least one of the respectively other units ($E_1$, . . . , $E_n$) partially or completely in terms of its respective interference level ($P_n$).

10 Claims, 2 Drawing Sheets

(56) References Cited

U.S. PATENT DOCUMENTS

| | | | |
|---|---|---|---|
| 9,918,410 B2* | 3/2018 | Humphrey | H05K 7/20718 |
| 2005/0001484 A1* | 1/2005 | Mohr | H02P 5/68 |
| | | | 307/24 |

* cited by examiner

EMC COOLING DEVICE

RELATED APPLICATIONS

This application claims priority to German Patent Application No. 10 2016 124 099.0, filed Dec. 12, 2016, and PCT/EP2017/077047, filed Oct. 24, 2017, the entire contents of which are incorporated herein by reference in their entirety.

FIELD

The present disclosure relates to a cooling apparatus comprising a metallic and/or electrically conductive EMC enclosure, a converter, and a plurality of electrically operated units within the EMC enclosure.

BACKGROUND

The shielding of electrical devices, facilities and rooms serves to keep electrical and/or magnetic fields therefrom or, conversely, to protect the environment of the devices from the fields emanating from the facility. The European EMC Directive defines electromagnetic compatibility as "the ability of an apparatus, equipment or system to operate satisfactorily in the electromagnetic environment without itself causing electromagnetic interferences which would be unacceptable for the apparatus, equipment or systems present in this environment".

Electromagnetic waves per se, which have both a magnetic and an electrical component, also often require shielding to prevent or reduce their outgoing or incoming radiation.

The effect of shielding is quantified by shielding attenuation. Transfer impedance is the measured parameter of the shielding effect for cable shields.

At the core of EMC are three key topics: equipment affects the environment, the environment affects the equipment, and components within an equipment affect each other through coupling mechanisms, such as impedance coupling, capacitive and inductive radiation superposition. The cause of an inductive coupling is an alternating magnetic field. A magnetic field forms around a current-carrying conductor and also penetrates adjacent conductors and apparatuses. A current change also causes a change in the magnetic field, which then induces a voltage in the adjacent electrically conductive components.

The interference variable of the capacitive coupling is the electrical voltage itself. Between two adjacent conductors of different electrical potential—such as power and signal conductors—capacitive coupling occurs. The lines represent capacities in the broadest sense. By means of the electric field, charges are shifted from one circuit to another via these parasitic coupling capacitances. The coupling capacitance is directly proportional to the length of the parallel routed lines and decreases with increasing distance between the conductors.

The effects of electrical or magnetic fields, effects of electromagnetic waves, and line-bound effects are to be distinguished. In addition, depending on the field of application, further extensive national and international standards and regulations must be observed. The current trends towards more and more wireless communication, continuing miniaturization, as well as digitization at ever higher clock speeds are exacerbating the problem of EMC compatibility.

In the prior art, there are various approaches to reduce such EMC interference. Thus, purely line-bound interferences can often be eliminated with suitable grounding guides or potential equalization or remedied with cable shields and with filters. The most common and effective measure against electromagnetic interference is a Faraday cage, which can be realized most simply by a metallic or conductive housing. Reduction of the inductive coupling takes place through adjacent laying of outgoing and incoming lines, i. e., minimization of the spanned area (smaller nonsymmetrical interferences), laying of the conductors directly on the ground structure (smaller nonsymmetrical interferences), reducing current changes, avoidance of parallel guide of line-different circuits, avoidance of large conductor loops and selecting suitable materials for low frequency and high frequency range.

The reduction of the capacitive coupling is done by maximizing the distance of the conductors to each other, by tight laying of the line to the ground structure, by using shielded cables, by inserting static shields (ground regions) and by spatial separation of sensitive circuits and circuits with sources of interference.

However, the aforementioned measures are countering the general trend that electrical systems should be increasingly scalable and modular and also increasingly more compactly built.

Especially with cooling devices, there is the problem that within a single enclosure usually a plurality of electrically powered machines must be accommodated. Such an exemplary cooling device is disclosed in DE 10 2015 108 910 A1.

Such a generic cooling device according to DE 10 2015 108 910 A1 often has a first fan for the flow through of a first heat exchanger with cabinet air and a second fan for the flow through of a second heat exchanger with ambient air.

Cooling devices are known from the prior art, in which the electrical components are adapted with respect to the supply voltage or mains voltage at the place of use. Thus, it is customary in the prior art to provide for each desired power stage of a cooling device in each case a specific variant for a mains voltage of 115 V, 230 V and 400 V as well as various special voltages. In this way, a largely worldwide use is possible.

Depending on the local mains voltage, for example, a corresponding transformer with a primary input of 115 V, 200, 230 V, 400 V or 460 V can be used, providing, depending on the primary input voltage, a secondary output voltage of 230 V, 400 V or 460 V at various performances. Depending on the secondary output voltage of the transformer, the cooling device has a controller which is operated at the respective secondary output voltage of the transformer and controls the controllable electrical components of the cooling device with appropriate voltages.

This fact in turn requires that these components which are controlled by the controller depending on the local region of use of the cooling device must be provided at an adapted voltage variant of 115 V, 200 V, 230 V, 400 V or 460 V, for example.

Cooling devices are also known from the prior art, in which the active device components are operated directly via a transformer with an adapted voltage.

In order to provide cooling devices of the generic type in a design for the various different mains voltages, it is proposed in the prior art to couple a voltage supply with an up-converter and/or down-converter, which is connected via a rectifier with a wide-range input for single- or multi-phase AC voltage and charges a capacitor to an intermediate circuit voltage which is above or below a mains voltage applied to the wide-range input, wherein a power supply of at least one of the two fans is connected in parallel to the capacitor.

In order to operate a compressor of a cooling device with a nominal three-phase voltage required for a particular compressor capacity regardless of an input AC voltage applied to the wide-range input, the three-phase current inverter is designed to either raise or lower the nominal three-phase voltage as a function of the required compressor capacity.

The operation of these cooling devices is typically realized by means of rectifying and raising and/or lowering the input AC voltage to a constant intermediate circuit DC voltage and supplying the intermediate circuit DC voltage to a power supply of the fan or the existing fans, the intermediate circuit DC voltage being dimensioned so that a power supply voltage can be provided via the power supply which is required for the operation of the fans.

We have found a disadvantage of such a solution within a preferably enclosed design is the fact that EMC-related problems already arise due to the design, wherein electromagnetic total field gains in particular occur due to the plurality of radiation-emitting electrical installations by at least galvanic and, or capacitive and/or inductive and, or radiation-overlapping coupling effects. Furthermore, the enclosure and shield countermeasure conditions deteriorate due to the design constraint to accommodate a plurality of electromagnetic field emitting machines or components, and the known measures to vary current and voltage are difficult to realize in the operating requirements of the plurality of electrically operating units.

BRIEF SUMMARY

The present disclosure is therefore based on the object to overcome the aforementioned disadvantages and to provide a cooling apparatus, which has improved EMC properties while reducing the number of required components and/or elements.

This object is achieved by the feature combination according to claim 1.

According to the present disclosure, it could be recognized that the EMC properties of the cooling apparatus are improved by skillful and targeted selection of the electrically operating machines and units and thus of the electromagnetic field emitting components as well as the reduction of the number of required components within a generic cooling apparatus.

A basic idea is not to supply the electrical units via separate power supplies, but to supply directly from the intermediate circuit or the inverter of a converter. In this way, both costs for components and additional measures for shielding can be reduced. Another advantage is the increase in reliability by eliminating the influences of EMC stress on such components.

According to the present disclosure it is therefore provided that the at least one fan is operated directly with the externally supplied and rectified supply voltage from the converter and can be integrated into the cooling device such that the one or more fans can be reversibly incorporated in the cooling apparatus and can be exchanged.

In this way, the at least one fan can be integrated into the cooling device in a modular and interchangeable manner, depending on the cooling task, so that the respective fan participates or is taken into account in the further EMC-reducing measures described below.

Another idea of the present disclosure is to reduce the line-bound and/or field-bound interferences by the remaining sources of interference, in particular the dynamic interferences, by means of compensation. Here the effect of radiation overlays in case of a plurality of sources of interference is utilized in such a way that the resulting radiation is reduced in terms of amplitude and/or frequency. In the following, the terms familiar to the person skilled in the art are used in this context.

Thus, the interference level describes the quantity/quantities that are used to quantify the EMC interference. Permissible emission of interference is regulated in detail within the EU by the protection requirements of the EMC directive, which refers to corresponding standards. These standards include the specific limits of interference levels for specific frequency ranges, device categories and environments. The immunity to electromagnetic interference denotes the desired resistance of a system to be tested to be able to work without interference up to a certain interference level with respect to a source of interference. The interference immunity cannot generally be expressed by an isolated value, but is to be defined by a number of parameters before the measurement in order then to be able to quantitatively detect, after the measurement, whether the interference level exceeds a defined limit.

Particularly suitable for determining the interference immunity is the frequency-dependent interference immunity in volt/meter with an amplitude modulation. For the purposes of the present present disclosure, a unit is referred to as EMC interference immune, when during the application of the unit with an interference variable of a certain interference level, said unit indeed shows a malfunction, but then without external intervention after a defined period of e.g. 2 seconds automatically returns to its normal state.

For the purposes of the present present disclosure, interference compensation means the compensation of a field interference by means of an opposing field in order to cancel out or compensate the interference by means of destructive interference, so that by a signal with a specific frequency and amplitude or polarity, by a signal with opposite amplitude or polarity, but the same frequency can be compensated.

According to the present disclosure, therefore, there is provided a cooling apparatus comprising a metallic and/or electrically conductive EMC enclosure, with a converter (preferably frequency converter) and a plurality of electrically operated units or working machines within the EMC enclosure, which are designed to influence a local temperature in at least one region inside or outside the EMC enclosure, wherein the converter directly supplies at least one or more of the units (e.g. fan) with a respective supply voltage.

The converter and the electrical units or working machines are advantageously designed in each case such that the line-bound and/or field-bound interferences which are specifically generated by this unit during operation of the cooling apparatus are compensated for by a line-bound and/or field-bound interference of at least one of the respectively other units partially or completely in terms of its respective interference level.

In a preferred embodiment of the present disclosure, it is provided that at least one or more of the units are fans, in particular internal and external fans.

It is further preferred if the at least one fan is mounted reversibly interchangeably with another fan in the cooling apparatus and the respective currently built-in fan is supplied directly with a supply voltage from a DC intermediate circuit of the converter so that a power supply for the respective fan is not is required.

It is particularly advantageous if the converter can provide various voltage levels at its voltage outputs, so that a flexible use is possible depending on the destination of the cooling apparatus and the selected fans. Preferably, the converter can also be operated at different input voltages and can then in each case generate a constant output voltage at which the device-internal voltage consumers can be operated.

In a further preferred embodiment of the present disclosure, it is provided that at least one of the further units is a refrigerating compressor. Advantageously, the refrigerating compressor is supplied by a supply voltage of the inverter of the converter.

Preferably, it is further provided that at least that line-bound and/or field-bound interference with the highest interference level (at a certain frequency or over a certain frequency range) is compensated so much by at least one line-bound and/or field-bound interference of one of the other units or the converter that the resulting (frequency dependent) interference level is below a specific interference immunity level of the one or the respective other units. By such a skillful compensation of interference variables by means of appropriately designed electrical units, overall a reduction of EMC interference susceptibility can be achieved and it can also be ensured that in the system only interference fields or EMC interferences are below the value of that unit, which has the lowest interference immunity in said frequency range.

In a further preferred embodiment of the present disclosure, it is therefore provided that the converter and the units are chosen and configured such that one or more of the respective interference levels of the line-bound and/or or field-bound interferences which are generated by the converter or the units in an isolated single operation, are compensated in the configuration implemented in the cooling apparatus and preferably below the interference immunity level of that unit which has the lowest interference immunity compared to the other units.

It is particularly advantageous if the respective compensation of the line-bound and/or field-bound interferences takes place by means of a destructive interference or superposition of the interferences involved therein.

According to the present disclosure, a control apparatus or control can further be provided in order to change or adapt the line-bound and/or field-bound interferences in the operation of the cooling apparatus in terms of their interference characteristics so that an interference compensation below a defined interference level takes place by the superposition of two or more of the changed line-bound and/or field-bound interferences. This measure can be carried out in particular frequency-dependent.

It is also advantageous if the number of sources of interference used is reduced by several or all electrically operated units are designed without power supply and are connected only to the converter for voltage supply.

BRIEF DESCRIPTION OF THE DRAWINGS

Other advantageous developments of the present disclosure are characterized in the dependent claims or are shown in more detail below together with the description of the preferred embodiment of the present disclosure with reference to the figures:

DETAILED DESCRIPTION

Figure 1:
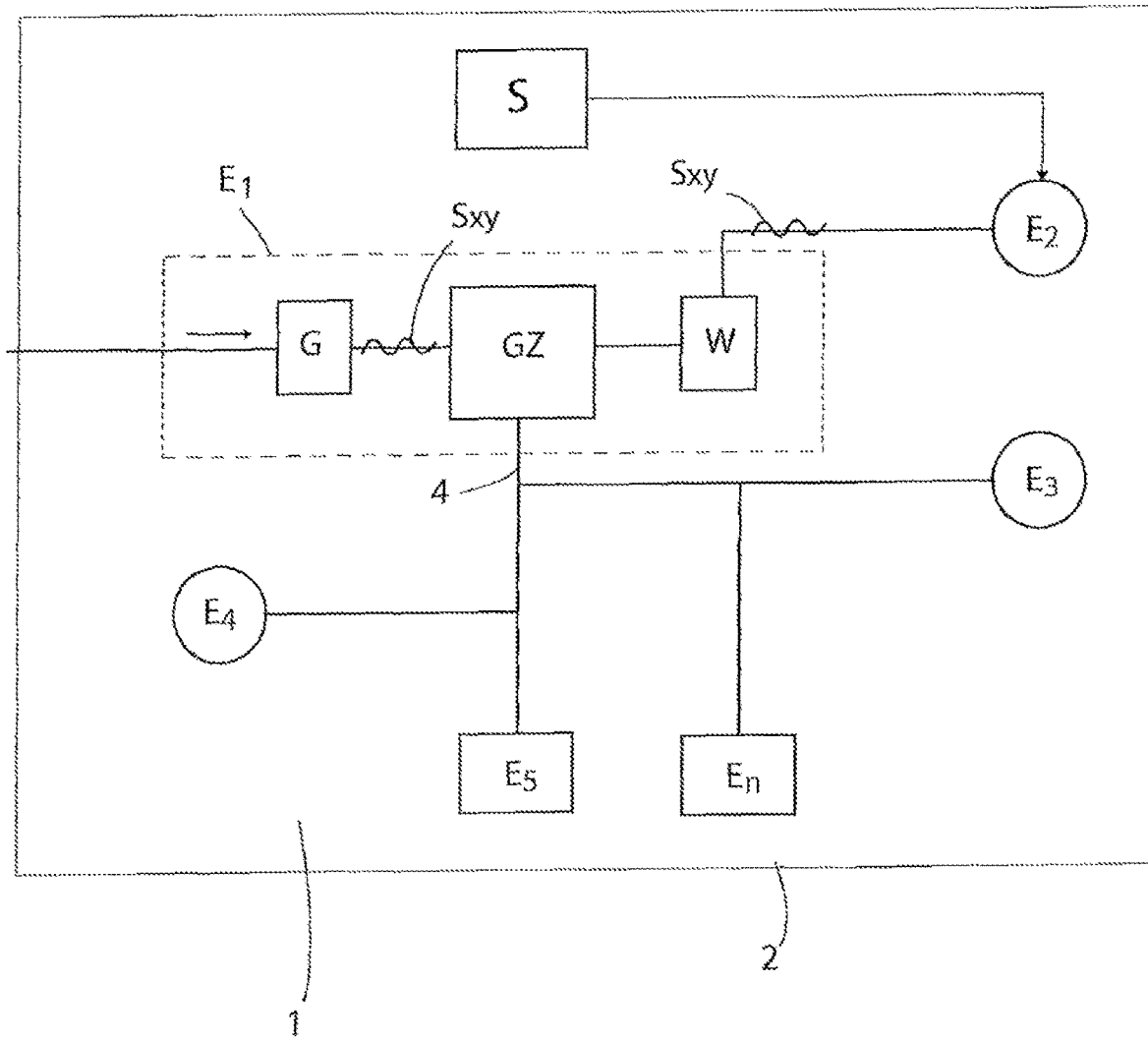
FIG. 1 shows a schematic view of a cooling apparatus according to the present disclosure and FIG. 2 shows a schematic representation of an interference field compensation.

In the following, the present disclosure will be explained in more detail with reference to an embodiment with reference to FIGS. 1 and 2, wherein like reference numerals refer to the same functional and/or structural features.

FIG. 1 shows an exemplary embodiment of a cooling apparatus 1 comprising a metallic and therefore conductive EMC enclosure 2. Enclosure 2 accommodates a frequency converter $E_1$ and several electrically operated units $E_2$, $E_3$, $E_4$, $E_5$, which will be described in more detail below. In operation of cooling apparatus 1, for example, the frequency converter $E_1$ generates a specific field-bound interference $S_{xy}$, wherein xy here represents a pairing each of the interference source and the interference sink.

This means at xy=12 that, e. g., an interference $S_{12}$ is such an EMC interference that acts on the unit $E_2$ from the frequency converter $E_1$.

In the present example, the frequency converter $E_1$ comprises a rectifier G, a DC intermediate circuit GZ and an inverter W. The DC intermediate circuit GZ is equipped with a power factor correction filter PFC.

The units $E_3$, $E_4$, represent fans, namely an internal fan $E_3$ and an external fan $E_4$. The unit $E_5$ is representative of an example of another electrically operated component such as a heater, a condensate evaporation or the like.

Unit $E_2$ represents a compressor which is supplied by a supply voltage of the inverter W of the frequency converter $E_1$.

The DC intermediate circuit GZ has a voltage tap 4 for each of the units $E_3$, $E_4$, $E_5$. Cooling apparatus 1 is designed so that the fans $E_3$, $E_4$ are mounted in the cooling apparatus reversibly exchangeably by another mounting compatible fan.

Figure 2:
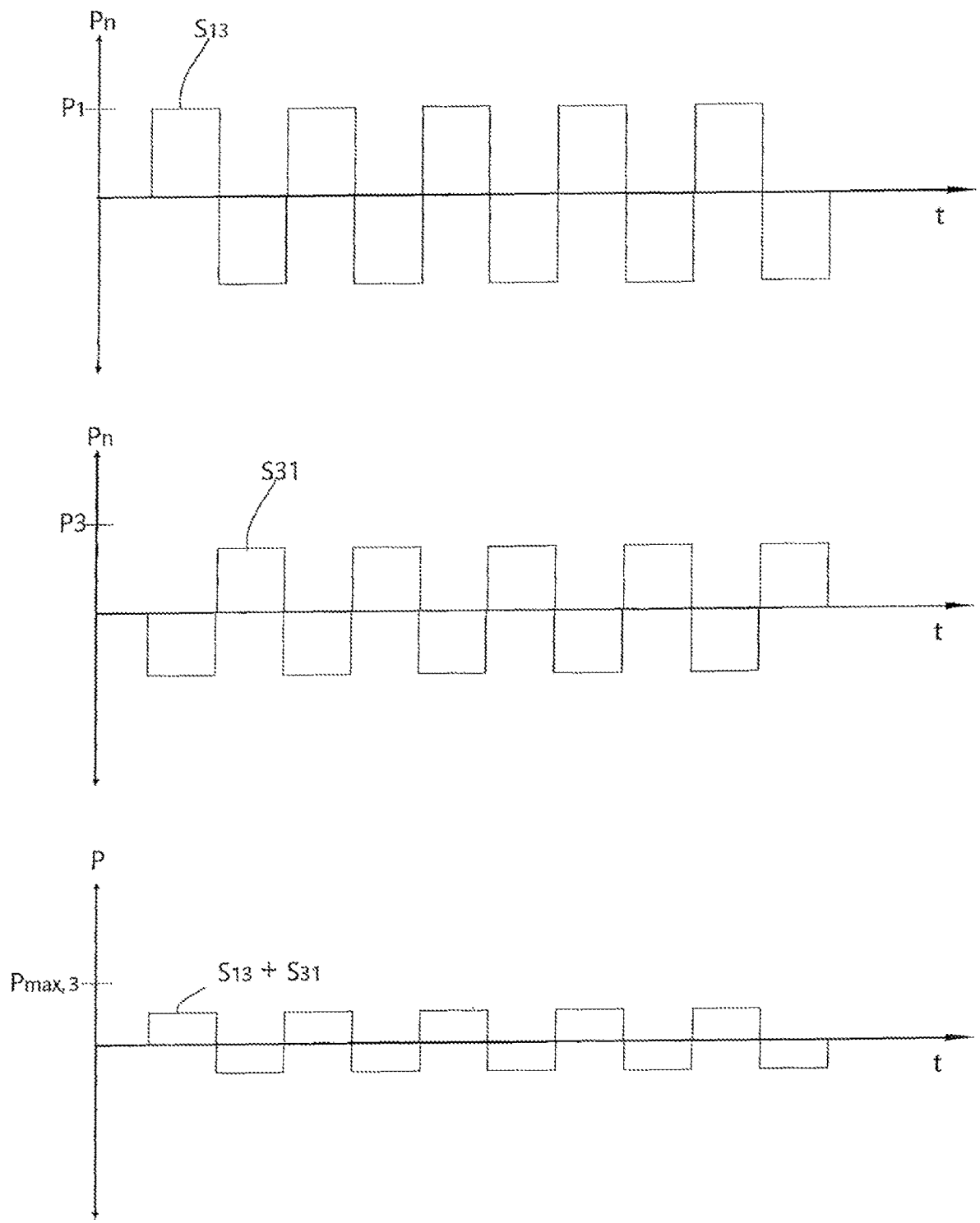

The frequency converter $E_1$ and the units $E_2$, $E_3$, $E_4$, $E_5$ are in each case designed so that the line-bound and/or field-bound interference $S_{xy}$ which is specifically generated by the respective component during operation of cooling apparatus 1 is compensated for by a line-bound and/or field-bound interference $S_{xy}$ of at least one of the respectively other components partially or completely in terms of their respective interference level $P_n$, as shown schematically in FIG. 2.

FIG. 2 shows an exemplary interference S13 (shown for reasons of simplification illustrated as a square wave signal) of frequency converter $E_1$ with a first interference level P1 and an interference S31 of the internal fan $E_3$ with an interference level P3 which compensates for this interference (for reasons of simplification illustrated as a square wave signal). By destructive interference of the interference signals S13 and S31, as shown in the lower view of FIG. 2, the interference is compensated for except for the difference in the magnitudes of the interference level maxima P1, P3, wherein the interference immunity level $P_{max,\ 3}$ of the internal fan $E_3$ has the lowest interference immunity level compared to the other units. Accordingly, the interference level after the compensation is lower than the interference immunity level $P_{max,\ 3}$ of the internal fan $E_3$.

Optionally, furthermore, a control device S can be provided in order to change the line-bound and/or field-bound interferences $S_{xy}$ during operation of cooling apparatus 1 in terms of its interference characteristics so that an interference compensation below a defined interference level takes place by the superposition of two or more of the changed line-bound and/or field-bound interferences $S_{xy}$.

The present disclosure is not limited in its embodiments to the above-mentioned preferred exemplary embodiments. Rather, a number of variants is conceivable, which makes use of the illustrated solution even with fundamentally different embodiments.

The invention claimed is:

1. A cooling apparatus comprising a metallic and/or electrically conductive EMC enclosure and a converter ($E_1$) and also a plurality of electrically operated units ($E_2, \ldots, E_n$) within the EMC enclosure, which is designed to influence a local temperature in at least one region inside or outside the EMC enclosure, wherein the converter ($E_1$) directly supplies one or more of the plurality of electrically operated units ($E_2, \ldots, E_n$) with a respective supply voltage, and wherein the converter ($E_1$) and the plurality of electrically operated units ($E_2, \ldots, E_n$) are each designed such that the line-bound and/or field-bound interference ($S_{xy}$) which is specifically generated by at least one of the plurality of electrically operated units during operation of the cooling apparatus is compensated for by a line-bound and/or field-bound interference ($S_{xy}$) of at least one of the respective other plurality of electrically operated units ($E_1, \ldots, E_n$) partially or completely in terms of its respective interference level ($P_n$), characterized in that the cooling apparatus is designed so that the at least one of the plurality of electrically operated units ($E_2, \ldots, E_n$) is mounted reversibly interchangeably with another of the plurality of electrically operated units ($E_2, \ldots, E_n$) in the cooling apparatus and the respective at least one of the plurality of electrically operated units ($E_2, \ldots, E_n$) is supplied directly with a supply voltage from a DC intermediate circuit (GZ) of the converter ($E_1$).

2. The cooling apparatus according to claim 1, wherein at least one or more of the plurality of electrically operated units ($E_2, \ldots, E_n$) are fans.

3. The cooling apparatus according to claim 2, wherein the fans are internal and external fans.

4. The cooling apparatus according to claim 1, wherein at least one of the plurality of electrically operated units ($E_2, \ldots, E_n$) is a refrigerating compressor.

5. The cooling apparatus according to claim 4, wherein the at least one refrigerating compressor is supplied by a supply voltage of an inverter (W) of the converter ($E_1$).

6. The cooling apparatus according to claim 1, wherein at least the line-bound and/or field-bound interference ($S_{xy}$) with the highest interference level (Pn) is compensated by at least one line-bound and/or field-bound interference ($S_{xy}$) of one of the plurality of electrically operated units ($E_2, \ldots, E_n$) or the converter ($E_1$) such that the resulting interference level ($P_n'$) is below a specific interference immunity level ($P_{max}$) of the one or the respective other plurality of electrically operated units ($E_2, \ldots, E_n$).

7. The cooling apparatus according to claim 1, wherein the converter ($E_1$) and the units ($E_2, \ldots, E_n$) are chosen such that one or more of the respective interference levels (Pn) of the line-bound and/or or field-bound interferences ($S_{xy}$) which are generated by the converter ($E_1$) or the plurality of electrically operated units ($E_2, \ldots, E_n$) in an isolated single operation, are compensated in the configuration implemented in the cooling apparatus below the interference immunity level ($P_{max, n}$) of that unit which has the lowest interference immunity level ($P_{max, n}$) compared to the other units.

8. The cooling apparatus according to claim 1, wherein the compensation of the line-bound and/or field-bound interferences ($S_{xy}$) takes place by means of a destructive interference or superposition.

9. The cooling apparatus according to claim 1, wherein at least one control apparatus (S) is provided and configured to change the line-bound and/or field-bound interferences ($S_{xy}$) in the operation of the plurality of electrically operated units of the cooling apparatus in terms of their interference characteristics so that an interference compensation below a defined interference level takes place by the superposition of two or more of the changed line-bound and/or field-bound interferences ($S_{xy}$).

10. The cooling apparatus according to claim 1, wherein a plurality of all the plurality of electrically operated units ($E_2, \ldots, E_n$) are designed without power supply and are connected only to the converter (E1) for voltage supply.

* * * * *